(12) United States Patent
Ishikawa et al.

(10) Patent No.: US 8,427,244 B2
(45) Date of Patent: Apr. 23, 2013

(54) OSCILLATION CIRCUIT AND FREQUENCY-CORRECTING OSCILLATION CIRCUIT

(75) Inventors: Masayuki Ishikawa, Suwa (JP); Kenasku Isohata, Kamiina (JP); Takehiro Yamamoto, Suwa (JP)

(73) Assignee: Seiko Epson Corporation (JP)

( * ) Notice: Subject to any disclaimer, the term of this patent is extended or adjusted under 35 U.S.C. 154(b) by 137 days.

(21) Appl. No.: 13/036,092

(22) Filed: Feb. 28, 2011

(65) Prior Publication Data

US 2011/0210796 A1   Sep. 1, 2011

(30) Foreign Application Priority Data

Mar. 1, 2010   (JP) ................... 2010-043833

(51) Int. Cl.
*H03L 7/085* (2006.01)

(52) U.S. Cl.
USPC ................ 331/1 A; 331/34; 331/16; 331/176

(58) Field of Classification Search ............... 331/16, 331/17, 1 A, 34
See application file for complete search history.

(56) References Cited

U.S. PATENT DOCUMENTS 5,023,572 A * 6/1991 Caldwell et al. ............ 331/10
2006/0071728 A1   4/2006 Chen

FOREIGN PATENT DOCUMENTS

JP   2003-324318   11/2003

* cited by examiner

*Primary Examiner* — Arnold Kinkead
(74) *Attorney, Agent, or Firm* — Harness, Dickey & Pierce, P.L.C.

(57) ABSTRACT

An oscillation circuit includes: an oscillator that includes a vibrator and outputs an oscillation signal; an F/V converter that converts the oscillation signal into a voltage corresponding to a frequency of the oscillation signal; and a memory circuit that stores frequency correcting information for correcting the frequency of the oscillation signal.

7 Claims, 4 Drawing Sheets

OSCILLATION CIRCUIT AND FREQUENCY-CORRECTING OSCILLATION CIRCUIT

BACKGROUND

1. Technical Field

The present invention relates to an oscillation circuit and a frequency-correcting oscillation circuit, and more particularly, to a circuit configuration for improving a precision error based on a temperature characteristic having a hysteresis characteristic with respect to a temperature variation.

2. Related Art

The frequency of a piezoelectric oscillator employing a quartz crystal vibrator has a temperature characteristic of a cubic curve in the case of an AT vibrator, but a method of causing a system such as a mobile-terminal GPS system to correct the temperature characteristic for use has been known. For example, JP-A-2003-324318 discloses a piezoelectric oscillator having a function of storing information on a frequency-temperature characteristic of the piezoelectric oscillator in a memory disposed in an IC of the piezoelectric oscillator and outputting temperature information. US Patent Application Publication No. 2006/0071728 discloses that a system corrects a frequency on the basis of temperature information.

Such a TSXO (Temperature Sensing Xtal Oscillator) has a function of outputting temperature detection data and an oscillation frequency at a certain ambient temperature and also has a function of storing the temperature detection data (for example, a temperature sensor voltage and a temperature constant) and the oscillation frequency at a arbitrary temperature in an internal memory. The data stored in the internal memory is data of the frequency measured at plural temperatures while varying the temperature or the temperature information in the process of manufacture and inspection. When an AT-cut quartz crystal vibrator using thickness-shear vibration is used, the frequency of the oscillator draws a positive cubic curve with respect to the temperature.

The system (for example, the mobile-terminal GPS system) derives the relation between the temperature (temperature sensor voltage) and the oscillation frequency using the information in the memory on the basis of the above-mentioned information. In a normal operation, the system detects the temperature output information and the output frequency of the oscillator, predicts a frequency deviation from a reference frequency (for example, a frequency at 25° C.) at the temperature, and determines the frequency correction amount. In this way, the frequency correction is carried out so as to keep the frequency constant at any temperature or the frequency is corrected by software.

As disclosed in JP-A-2003-324318, in a piezoelectric oscillator in which an IC including an oscillation circuit, a temperature sensor, and a memory is connected to a quartz crystal vibrator, it is assumed that the frequency of the piezoelectric oscillator to the original temperature (temperature sensor voltage) is 1:1. For example, FIG. 6 shows the temperature characteristic of a temperature sensor voltage, in which the temperature sensor voltage varies substantially linearly with respect to a variation in temperature. This temperature is a temperature of a semiconductor having a temperature sensor, strictly has a difference from the temperature of the quartz crystal vibrator, and is affected by the structure of the oscillator. FIG. 7 shows the frequency-temperature characteristic of an ideal piezoelectric oscillator. However, in fact, the temperature-rising characteristic and the temperature-falling characteristic differ finely from each other (which is called a hysteresis characteristic).

That is, as shown in FIG. 8, the temperature characteristic of the quartz crystal vibrator may have a hysteresis characteristic in which the temperature-rising characteristic 53 is different from the temperature-falling characteristic 54. In this case, two frequencies exist at a temperature, which causes a precision error. In other words, the temperature sensor voltage and the frequency of the piezoelectric oscillator do not have a complete correspondence of 1:1.

Therefore, in systems such as a mobile-terminal GPS system requiring high precision, it is necessary to improve the hysteresis characteristic. However, to satisfy such a requirement, the structure of the quartz crystal vibrator or the method of mounting the quartz crystal vibrator on a package has to be reviewed and the stable productivity thereof is also required, which cannot be easily handled.

SUMMARY

An advantage of some aspects of the invention is that it provides an oscillator which can correct a deviation in oscillation frequency with high precision. Here, a voltage corresponding to a frequency deviation is output using an F/V converter that generates a voltage corresponding to an oscillation frequency instead of the temperature sensor voltage. This voltage has a correspondence of 1:1 with respect to the variation of the oscillation frequency. Accordingly, it is not necessary to acquire the temperature sensor voltage and it is possible to acquire variation in oscillation frequency as voltage information. As a result, this output voltage is input to a system.

Application Example 1

According to this application example of the invention, there is provided an oscillation circuit including: an oscillator that includes a vibrator and outputs an oscillation signal; an F/V converter that converts the oscillation signal into a voltage corresponding to a frequency of the oscillation signal; and a memory circuit that stores frequency correcting information for correcting the frequency of the oscillation signal.

When a frequency is corrected by the use of a temperature sensor in the related art, the temperature sensor voltage and the frequency of the piezoelectric oscillator did not have a correspondence of 1:1. Therefore, a calculation for correlating the frequency with the temperature sensor voltage was necessary. In a vibrator having a temperature characteristic called a hysteresis characteristic in which a temperature-rising characteristic and a temperature-falling characteristic are different from each other, since the frequency also varies according thereto, an error might occur between the rise in temperature and the fall in temperature. However, this application example of the invention provides an F/V converter that converts an oscillation signal into a voltage corresponding to the frequency instead of the temperature sensor and uses the output voltage thereof as the frequency deviation voltage. Accordingly, it is possible to correlate the frequency deviation voltage with the frequency of the piezoelectric oscillator in a correspondence of 1:1.

Application Example 2

According to this application example of the invention, the oscillation circuit may further include a frequency divider that divides the frequency of the oscillation signal, and the signal divided by the frequency divider may be output to the F/V converter.

When the frequency of the oscillation signal is high, it is necessary to select an F/V converter that can follow the frequency. However, the F/V converter having a high frequency in use causes a high component cost and the increase in frequency causes an increase in power consumption. Therefore, this application example of the invention provides a frequency divider that divides the frequency of the oscillation signal and the signal divided by the frequency divider is converted by the F/V converter. Accordingly, even when the oscillation frequency is high, it is possible to employ an F/V converter with a low cost and to reduce the power consumption of the oscillation circuit.

Application Example 3

According to this application example of the invention, the oscillation circuit may further include a division ratio setting unit that sets a division ratio of the frequency divider to a predetermined value.

In the F/V converter, an upper limit frequency convertible is prescribed. Therefore, it is necessary to determine the division ratio of the frequency divider depending on the oscillation frequency. Accordingly, this application example of the invention provides a division ratio setting unit that sets the division ratio of the frequency divider to a predetermined value. As a result, it is possible to arbitrarily set the optimal division ratio depending on the oscillation frequency.

Application Example 4

According to this application example of the invention, the oscillation circuit may further include a switch that supplies either the oscillation signal or the signal divided by the frequency divider as an input of the F/V converter.

In an oscillation circuit in which the range of the oscillation frequency thereof can be set to be wide, the frequency may be divided or not divided depending on the oscillation frequency. In this case, a frequency divider is provided as a circuit and a configuration determining whether to use the frequency divider is necessary. Therefore, this application example of the invention provides a switch that supplies either the oscillation signal or the signal divided by the frequency divider as an input of the F/V converter. Accordingly, it is possible to provide an oscillation circuit which can cope with a wide oscillation frequency with a simple operation.

Application Example 5

According to this application example of the invention, there is provided a frequency-correcting oscillation circuit including: an oscillator that includes a vibrator and outputs an oscillation signal; an F/V converter that converts the oscillation signal into a voltage corresponding to a frequency of the oscillation signal; a memory circuit that stores frequency correcting information for correcting the frequency of the oscillation signal; and a frequency correcting circuit that corrects the frequency of the oscillation signal on the basis of the output voltage of the F/V converter and the frequency correcting information.

When a frequency is corrected by the use of a temperature sensor in the related art, the temperature sensor voltage and the frequency of the piezoelectric oscillator did not have a correspondence of 1:1. Therefore, a calculation for correlating the frequency with the temperature sensor voltage was necessary. In a vibrator having a temperature characteristic called a hysteresis characteristic in which a temperature-rising characteristic and a temperature-falling characteristic are different from each other, since the frequency also varies according thereto, an error might occur between the rise in temperature and the fall in temperature. However, this application example of the invention provides an F/V converter that generates a voltage corresponding to the frequency instead of the temperature sensor, outputs the output voltage thereof as a frequency deviation voltage, and corrects the frequency of the oscillation signal on the basis of the voltage and the frequency correcting information. Accordingly, it is possible to correct the frequency of the oscillation signal by correlating the frequency deviation voltage with the frequency of the piezoelectric oscillator in a correspondence of 1:1.

Application Example 6

According to this application example of the invention, the frequency-correcting oscillation circuit may further include a frequency divider that divides the frequency of the oscillation signal, and the signal divided by the frequency divider may be output to the F/V converter.

According to this configuration, it is possible to obtain the same operational advantage as in the application example 2.

Application Example 7

According to this application example of the invention, the frequency-correcting oscillation circuit may further include a division ratio setting unit that sets a division ratio of the frequency divider to a predetermined value.

According to this configuration, it is possible to obtain the same operational advantage as in the application example 3.

Application Example 8

According to this application example of the invention, the frequency-correcting oscillation circuit may further include a switch that supplies either the oscillation signal or the signal divided by the frequency divider as an input of the F/V converter.

According to this configuration, it is possible to obtain the same operational advantage as in the application example 4.

Application Example 9

According to this application example of the invention, the frequency correcting information may be temperature compensating information used to compensate for a frequency-temperature characteristic of the oscillation signal.

The memory circuit stores the frequency-temperature information representing the frequency-temperature characteristic in an area surrounded with two frequency-temperature characteristics of the oscillation signals, which result from the influence of the hysteresis characteristic. Therefore, the frequency-correcting oscillation circuit reads the frequency unique to the received output voltage of the F/V converter from the memory circuit, and corrects the frequency on the basis of the data. Accordingly, since the oscillation frequency to be corrected is directly determined with respect to the output voltage (temperature sensor output) of the F/V converter, it is possible to easily compensate for the oscillation frequency with high precision.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
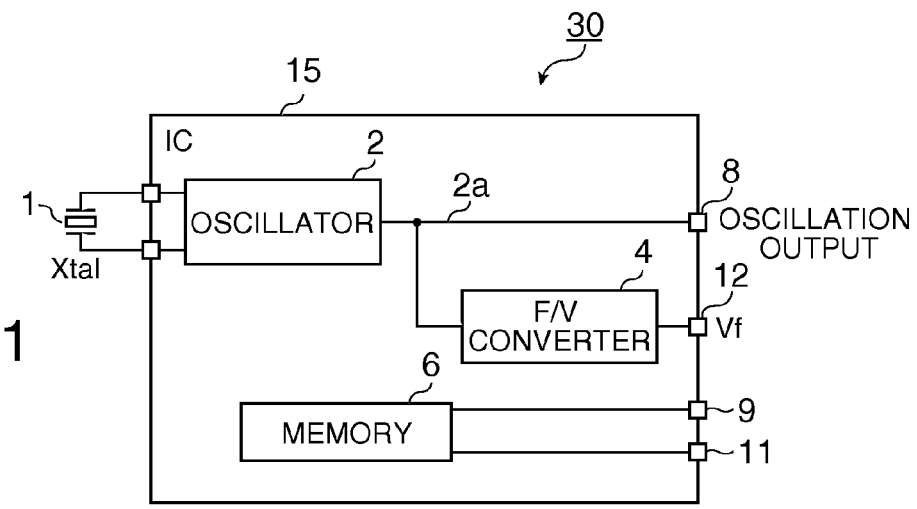
FIG. 1 is a diagram illustrating the configuration of an oscillation circuit according to a first embodiment of the invention.

Hereinafter, the invention will be described in detail with reference to embodiments shown in the drawings. However, elements, types, combinations, shapes, and relative arrangements thereof described in the embodiments are not intended to limit the scope of the invention thereto as long as they are not described otherwise, and are only exemplary.

FIG. 1 is a diagram illustrating the configuration of an oscillation circuit according to a first embodiment of the invention. The oscillation circuit 30 includes an oscillator (oscillator) 2 that has a quartz crystal vibrator (vibrator) 1 and outputs an oscillation signal 2a, an F/V converter (F/V converter) 4 that converts the frequency of the oscillation signal 2a into a corresponding voltage, a memory (memory circuit) 6 that stores frequency correcting information for correcting the frequency of the oscillation signal 2a, all of which are formed in a body by an IC package 15. The IC package 15 includes an oscillation output terminal 8, a frequency deviation voltage output terminal (F/V converter output terminal) 12, memory output terminals 9 and 11, and a quartz crystal vibrator terminal.

Figure 9:
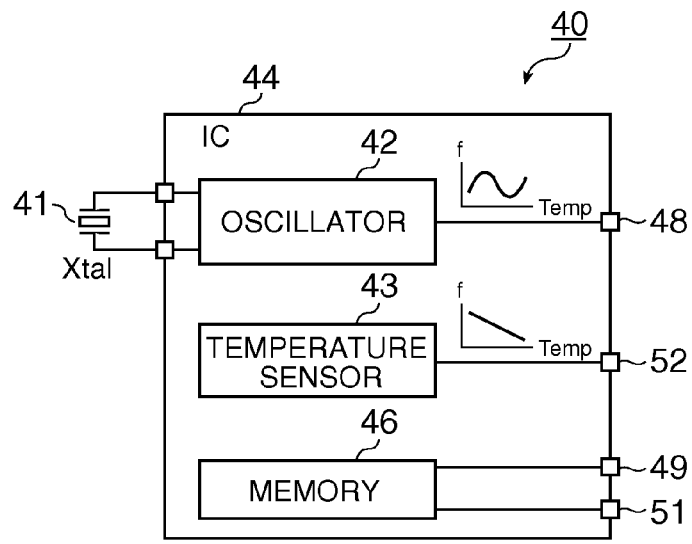
FIG. 9 is a diagram illustrating the configuration of the piezoelectric oscillator according to the related art.

That is, an oscillator 40 according to the related art shown in FIG. 9 includes a temperature sensor 43 used to acquire temperature information, but the oscillation signal 2a is converted by F/V conversion without using the temperature sensor 43 and the frequency deviation is output directly in terms of a voltage. Regarding the frequency-temperature characteristic of the oscillator 2, since the temperature characteristic of the quartz crystal vibrator is expressed as the oscillation frequency, the frequency varies with respect to the temperature. In the past, the variation of the oscillation frequency with respect to the temperature was predicted from the temperature information and the temperature information was acquired from the voltage of the temperature sensor provided independently. Accordingly, three different parameters of temperature, voltage, and frequency were necessary.

In the oscillator 40 according to the related art shown in FIG. 9, since the oscillator 42 and the temperature sensor 43 were provided as independent circuits, the oscillation frequency and the characteristic of the temperature sensor 43 did not have a complete correspondence of 1:1 due to the thermal conduction based on the structure or the hysteresis of the quartz crystal vibrator 41.

Figure 2A:
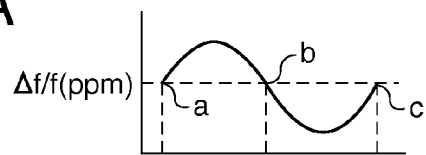
FIG. 2A is a diagram illustrating the relation between an oscillation frequency and a temperature.
Figure 2B:
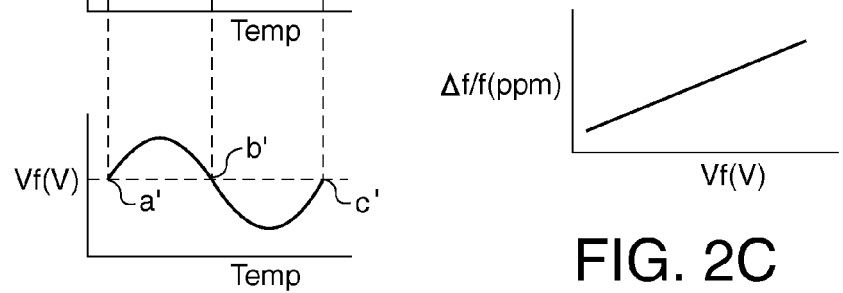
FIG. 2B is a diagram illustrating the relation between a frequency deviation voltage and a temperature.
Figure 2C:
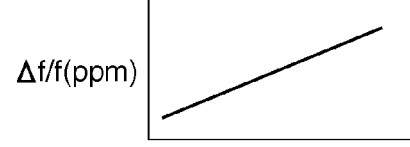
FIG. 2C is a diagram illustrating the relation between a frequency and the frequency deviation voltage.

However, in this embodiment, the temperature sensor 43 is not necessary and the parameter of temperature can be excluded. Three parameters were necessary in the past, but two parameters of voltage and frequency are necessary in this embodiment. As shown in FIG. 1, the frequency deviation can be acquired as a voltage by F/V converting the frequency of the quartz crystal vibrator 1. The frequency deviation voltage acquired by the F/V conversion and the oscillation frequency have a correlation. As shown in FIGS. 2A to 2C, similarly to the temperature characteristic of the oscillator (FIG. 2B), the frequency deviation voltage has a cubic temperature characteristic with respect to the temperature (FIG. 2B). However, since the frequency deviation voltage and the oscillation frequency $\Delta f/f$ have a correspondence of 1:1, an oscillation frequency to be corrected is directly determined for the frequency deviation voltage, thereby easily compensating for the frequency with high precision.

Figure 10A:
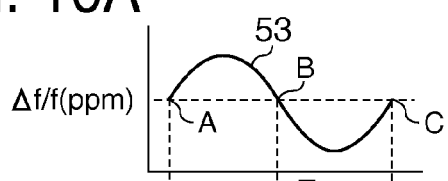
FIG. 10A is a diagram illustrating the relation of the frequency of the piezoelectric oscillator according to the related art and the temperature.
Figure 10C:
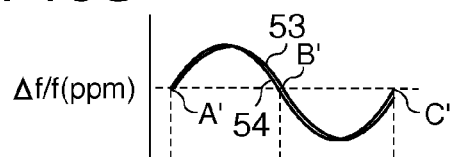
FIG. 10C is a diagram illustrating the relation between the piezoelectric oscillator according to the related art having the hysteresis characteristic and the temperature.
Figure 10B:
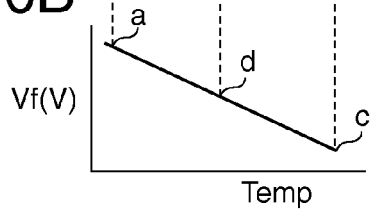
FIG. 10B is a diagram illustrating the relation between the temperature sensor output and the temperature.
Figure 10D:
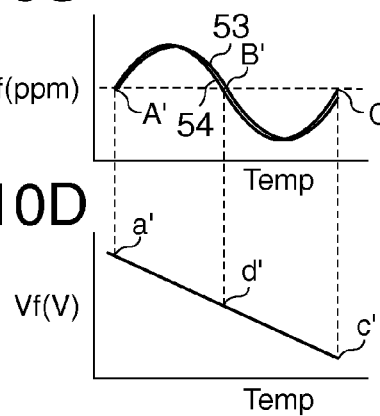
FIG. 10D is a diagram illustrating the relation between the temperature sensor output and the temperature.

The relation between the temperature sensor voltage and the oscillation frequency is compared. As shown in FIGS. 10A to 10D, the cubic temperature characteristic 53 appears with the rise in temperature as shown in FIG. 10A, the sensor voltages Vf corresponding to points A, B, and C become points a, b, and c, respectively, in FIG. 10B, a cubic temperature characteristic 54 appears with the fall in temperature as shown in FIG. 10C, and the sensor voltages Vf corresponding to points A', B', and C' become points a', b', and c', respectively, in FIG. 10D. In this case, the oscillation frequencies at different temperature points A, B, and C are the same. On the contrary, the temperature sensor voltages are different from each other. To form this relation, it is necessary to calculate a relational expression with the temperature using the parameter (condition) of temperature common to both and to correlate both with each other. That is, the procedure is carried out in the order of the measurement of the temperature sensor voltage Vf→, the calculation (prediction) of the temperature→the prediction of the oscillation frequency→the correction by the system.

On the contrary, the temperature need not be used as the parameter referring to FIGS. 2A to 2C. As shown in FIG. 2C, since the oscillation frequency $\Delta f/f$ with respect to the frequency deviation voltage Vf has a linear correspondence of 1:1, the concept of temperature can be removed. That is, the procedure is carried out in the order of the measurement of the frequency deviation voltage Vf→the prediction of the oscillation frequency→the correction by the system. Accordingly, it is possible to improve the correction precision and to simplify the correcting system.

This causes an advantage of reducing the amount of information to be stored in the memory, thereby reducing the size of the memory and thus reducing the size of the IC chip as a result.

As described above, when a frequency is corrected by the use of a temperature sensor in the related art, the temperature sensor voltage Vf and the frequency Δf/f of the piezoelectric oscillator did not have an ideal correspondence of 1:1. Therefore, a calculation for correlating the frequency Δf/f with the temperature sensor voltage Vf was necessary. In a quartz crystal vibrator 1 having a temperature characteristic called a hysteresis characteristic in which a temperature-rising characteristic and a temperature-falling characteristic are different from each other, since the temperature characteristic also varies according thereto, an error might occur between the rise in temperature and the fall in temperature. However, the invention provides an F/V converter 4 that generates a voltage corresponding to the frequency instead of the temperature sensor 43 and uses the output voltage thereof as the frequency deviation voltage Vf. Accordingly, it is possible to correlate the frequency deviation voltage Vf with the frequency Δf/f of the piezoelectric oscillator in a correspondence of 1:1.

Figure 3:
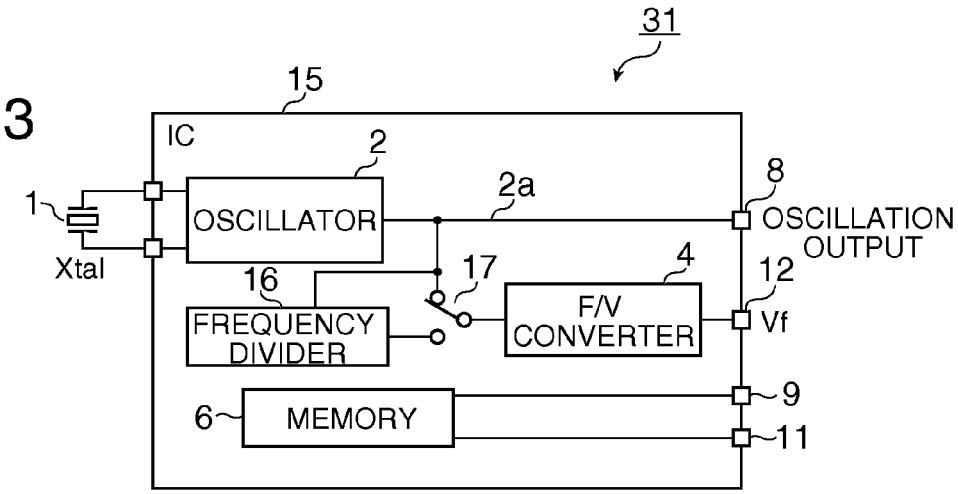
FIG. 3 is a diagram illustrating the configuration of an oscillation circuit according to a second embodiment of the invention.

FIG. 3 is a diagram illustrating the configuration of an oscillation circuit according to a second embodiment of the invention. The oscillation circuit 31 includes a frequency divider 16 that divides the frequency of the oscillation signal 2a, in addition to the configuration shown in FIG. 1, and is configured to output the signal divided by the frequency divider 16 to the F/V converter 4. The oscillation circuit further includes a switch (switch) 17 that supplies either the oscillation signal 2a or the signal divided by the frequency divider 16 as an input of the F/V converter 4. The oscillation circuit further includes a division ratio setting unit that sets the division ratio of the frequency divider 16 to a predetermined value, which is not shown.

That is, when the frequency of the oscillation signal 2a is high, it is necessary to select an F/V converter that can follow the frequency. However, the F/V converter having a high frequency in use causes a high component cost and the increase in frequency causes an increase in power consumption. Therefore, this embodiment provides a frequency divider 16 that divides the frequency of the oscillation signal 2a and the signal divided by the frequency divider 16 is converted by the F/V converter 4. Accordingly, even when the oscillation frequency is high, it is possible to employ an F/V converter 4 with a low cost and to reduce the power consumption of the oscillation circuit.

In an oscillation circuit in which the variable range of the oscillation frequency thereof can be set to be wide, the frequency may be divided or not divided depending on the oscillation frequency. In this case, a frequency divider 16 is provided as a circuit and a configuration determining whether to use the frequency divider 16 is necessary. Therefore, the invention provides a switch 17 that supplies either the oscillation signal 2a or the signal divided by the frequency divider 16 as an input of the F/V converter 4. Accordingly, it is possible to provide an oscillation circuit which can cope with a wide oscillation frequency with a simple operation.

In the F/V converter 4, an upper limit frequency convertible is prescribed. Therefore, it is necessary to determine the division ratio of the frequency divider 16 depending on the oscillation frequency. Accordingly, this embodiment provides a division ratio setting unit (not shown) that sets the division ratio of the frequency divider 16 to a predetermined value. As a result, it is possible to arbitrarily set the optimal division ratio depending on the oscillation frequency.

Figure 4:
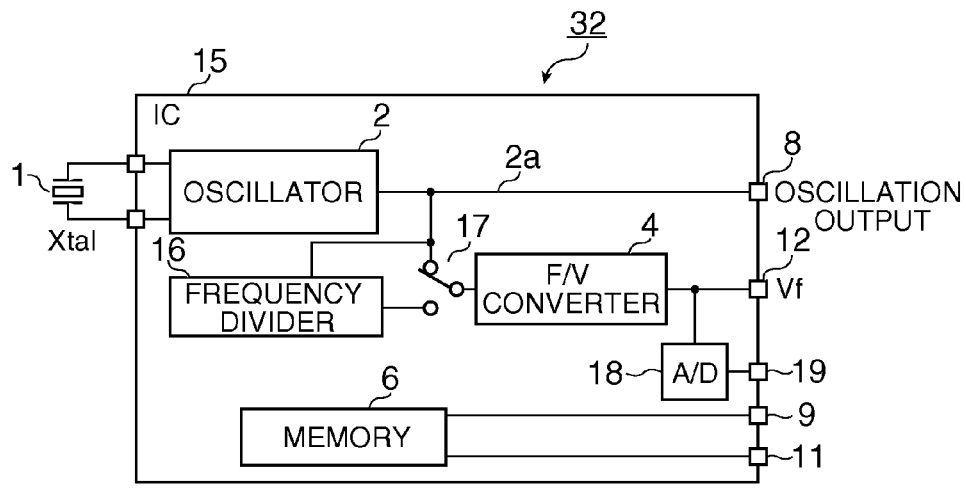
FIG. 4 is a diagram illustrating the configuration of an oscillation circuit according to a third embodiment of the invention.

FIG. 4 is a diagram illustrating the configuration of an oscillation circuit according to a third embodiment of the invention. The oscillation circuit 32 further includes an A/D converter 18 that converts the output signal of the F/V converter 4 shown in FIG. 3 into a digital signal. In the embodiment shown in FIG. 4, the output signal of the F/V converter 4 is output to a terminal 12 and the output of the A/D converter 18 is output to a terminal 19. However, only the terminal 19 may be provided. In the embodiment shown in FIG. 1, the A/D converter 18 that converts the output signal of the F/V converter 4 into a digital signal may be provided similarly. Accordingly, the system need not convert the frequency deviation voltage Vf into a digital value, thereby reducing the load of the system.

Figure 5:
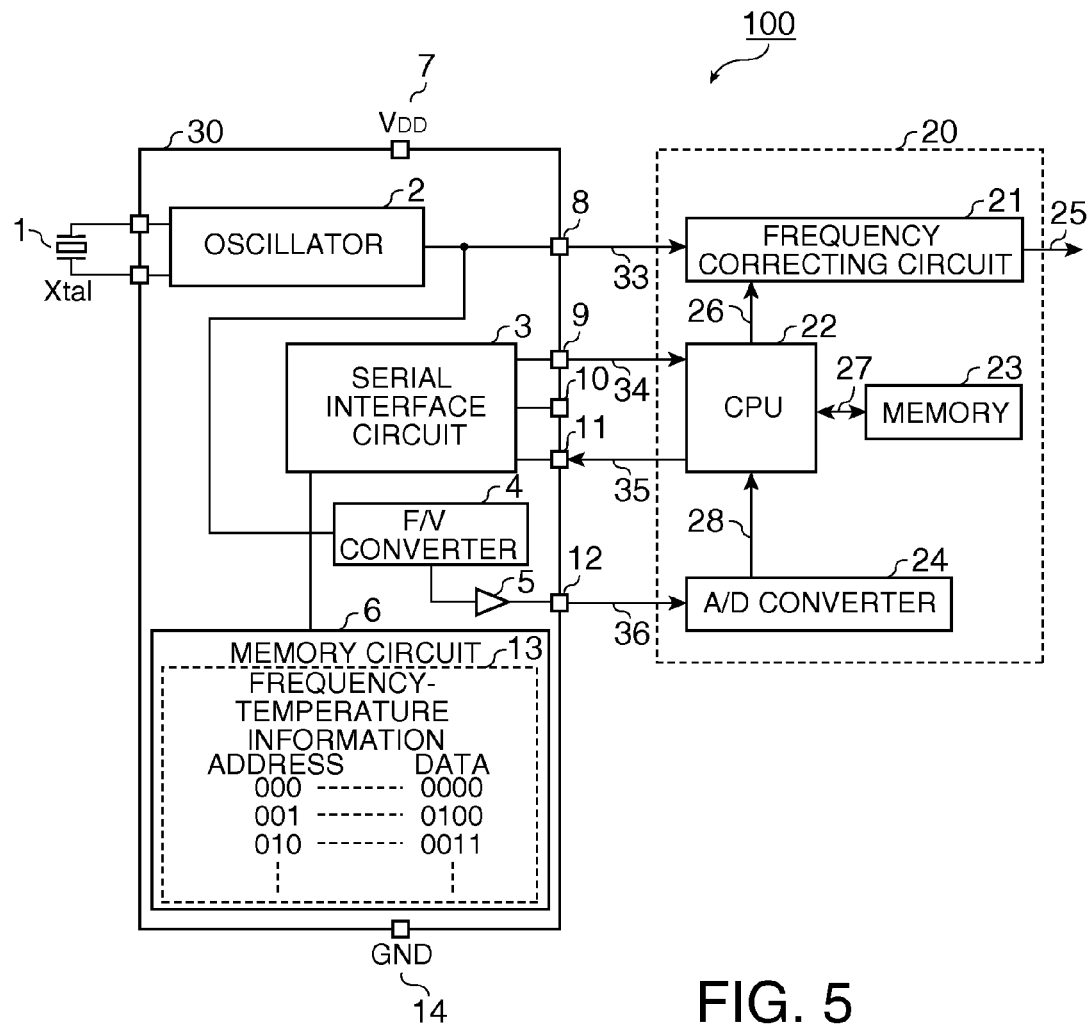
FIG. 5 is a diagram illustrating an example of a frequency-correcting oscillation circuit according to the invention.
Figure 6:
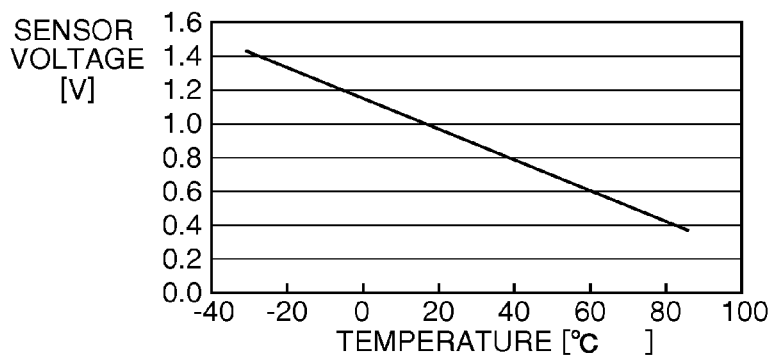
FIG. 6 is a diagram illustrating the relation between a sensor voltage of a piezoelectric oscillator according to the related art and a temperature.
Figure 7:
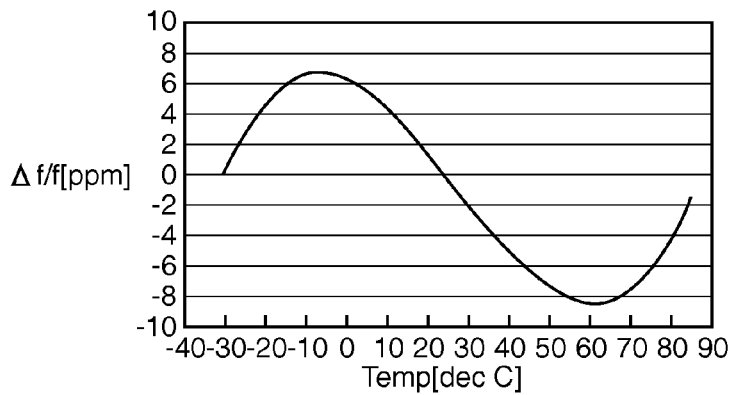
FIG. 7 is a diagram illustrating the relation between a frequency of an ideal piezoelectric oscillator and the temperature.
Figure 8:
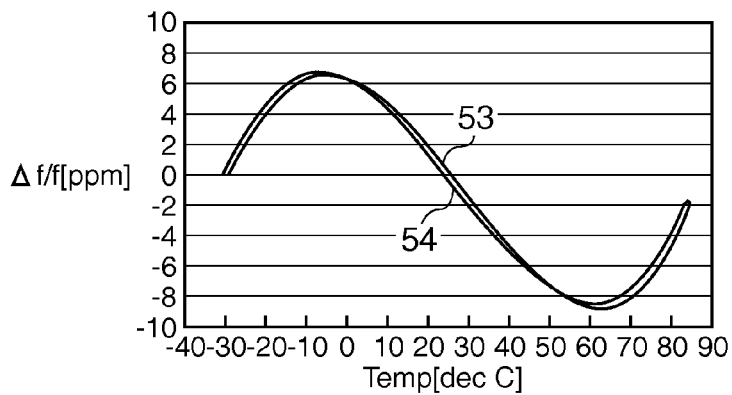
FIG. 8 is a diagram illustrating the relation between a frequency of a piezoelectric oscillator having a hysteresis characteristic according to the related art and the temperature.

FIG. 5 is a diagram illustrating the configuration of a frequency-correcting oscillation circuit according to an embodiment of the invention. A frequency-correcting oscillation circuit 100 according to this embodiment includes a piezoelectric vibrator 1 having a hysteresis characteristic in its frequency-temperature characteristic, an oscillation circuit 2 that oscillates the piezoelectric vibrator 1 and outputs an oscillation signal 33, and a memory circuit 6. The memory circuit 6 stores the frequency-temperature information 13 representing the frequency-temperature characteristic in an area surrounded with two frequency-temperature characteristics of the oscillation signals, which result from the influence of the hysteresis characteristic. Here, two frequency-temperature characteristics mean the frequency-temperature characteristic at the time of a rise in the temperature of the piezoelectric vibrator 1 and the frequency-temperature characteristic at the time of a fall in the temperature thereof. An area surrounded with the two characteristic curves centered on the reference temperature appears. The frequency-correcting oscillation circuit 100 is connected to a temperature compensating circuit 20 at the time of working.

More specifically, the frequency-correcting oscillation circuit 100 according to this embodiment includes a piezoelectric vibrator 1 having a hysteresis characteristic in its frequency-temperature characteristic, an oscillation circuit 2 that oscillates the piezoelectric vibrator 1 to output an oscillation signal 33 and outputs the oscillation signal 33 to a temperature compensating circuit 20 which can calculate a temperature compensation amount 26 using frequency-temperature information 34 representing the temperature characteristic of the oscillation frequency of the piezoelectric vibrator 1 and temperature information of the piezoelectric vibrator 1 at the time of oscillating the oscillation signal 33, and a memory circuit 6 that stores as frequency-temperature information 13 an intermediate value of temperature-rising frequency-temperature information 53 of the piezoelectric vibrator 1 generated when the ambient temperature of the piezoelectric vibrator 1 rises and temperature-falling frequency-temperature information 54 of the piezoelectric vibrator 1 generated when the ambient temperature falls and outputs the frequency-temperature information 13 to the temperature compensating circuit 20.

The frequency-correcting oscillation circuit further includes an F/V converter 4 that converts the frequency deviation into a voltage and outputs the voltage as a detection voltage 36. The frequency-temperature information 34 is calculated on the basis of the temperature-rising frequency-temperature information 53 and the temperature-falling frequency-temperature information 54 which are expressed as a function of the detection voltage 36 and is stored in the memory circuit 6. The oscillation circuit outputs the oscillation signal 33 to the temperature compensating circuit 20 that calculates the temperature correction amount 26 using the frequency-temperature information 13 and the detection voltage 36. The F/V converter outputs the detection voltage 36 to the temperature compensating circuit 20.

That is, when the frequency is corrected by the use of a temperature sensor in the related art, the temperature sensor voltage and the frequency of the piezoelectric oscillator did not have a correspondence of 1:1. Therefore, a calculation for correlating the frequency with the temperature sensor voltage was necessary. In a vibrator having a temperature characteristic called a hysteresis characteristic in which the temperature-rising characteristic and the temperature-falling characteristic are different from each other, since the temperature sensor voltage also varies according thereto, an error might occur between the rise in temperature and the fall in temperature. However, this embodiment provides the F/V converter 4 that generates a voltage corresponding to the frequency instead of the temperature sensor, detects the output voltage thereof as the temperature sensor voltage 36, and corrects the frequency of the oscillation signal on the basis of the voltage and the frequency correcting information 34. Accordingly, it is possible to correct the frequency of the oscillation signal by correlating the temperature sensor voltage with the frequency of the piezoelectric oscillator in a correspondence of 1:1.

The entire disclosure of Japanese Patent Application No 2010-043833, filed Mar. 1, 2010 is expressly incorporated by reference herein.

What is claimed is:

1. An oscillation circuit comprising:
   an oscillator that includes a vibrator and outputs an oscillation signal;
   an F/V converter that converts the oscillation signal into a voltage corresponding to a frequency of the oscillation signal;
   a frequency divider that divides the frequency of the oscillation signal and that outputs a divided signal; and
   a memory circuit that stores frequency correcting information for correcting the frequency of the oscillation signal, wherein
   the divided signal is input to the F/V converter.

2. The oscillation circuit according to claim 1, further comprising a division ratio setting unit that sets a division ratio of the frequency divider to a predetermined value.

3. The oscillation circuit according to claim 1, further comprising a switch that supplies either the oscillation signal or the divided signal divided by the frequency divider as an input of the F/V converter.

4. A frequency-correcting oscillation circuit comprising:
   an oscillator that includes a vibrator and outputs an oscillation signal;
   an F/V converter that converts the oscillation signal into a voltage corresponding to a frequency of the oscillation signal;
   a frequency divider that divides the frequency of the oscillation signal and that outputs a divided signal;
   a memory circuit that stores frequency correcting information for correcting the frequency of the oscillation signal; and
   a frequency correcting circuit that corrects the frequency of the oscillation signal on the basis of the output voltage of the F/V converter and the frequency correcting information, wherein
   the divided signal is input to the F/V converter.

5. The frequency-correcting oscillation circuit according to claim 4, further comprising a division ratio setting unit that sets a division ratio of the frequency divider to a predetermined value.

6. The frequency-correcting oscillation circuit according to claim 4, further comprising a switch that supplies either the oscillation signal or the divided signal divided by the frequency divider as an input of the F/V converter.

7. The frequency-correcting oscillation circuit according to claim 4, wherein the frequency correcting information is temperature compensating information used to compensate for a frequency-temperature characteristic of the oscillation signal.

* * * * *

UNITED STATES PATENT AND TRADEMARK OFFICE
CERTIFICATE OF CORRECTION

PATENT NO. : 8,427,244 B2  
APPLICATION NO. : 13/036092  
DATED : April 23, 2013  
INVENTOR(S) : Masayuki Ishikawa et al.

Page 1 of 1

It is certified that error appears in the above-identified patent and that said Letters Patent is hereby corrected as shown below:

Title Page, Inventors, item (75),  "Kenasku Isohata" should be --Kensaku Isohata--

Signed and Sealed this
Ninth Day of July, 2013

Teresa Stanek Rea
*Acting Director of the United States Patent and Trademark Office*